United States Patent [19]

Meijer et al.

[11] Patent Number: 5,301,013
[45] Date of Patent: Apr. 5, 1994

[54] POSITIONING DEVICE HAVING TWO MANIPULATORS OPERATING IN PARALLEL, AND OPTICAL LITHOGRAPHIC DEVICE PROVIDED WITH SUCH A POSITIONING DEVICE

[75] Inventors: Hendricus J. M. Meijer, Veldhoven; Johannes A. Rozenveld, Maarheeze; Adrianus J. Vermeer, Eindhoven; Jan A. Markvoort, Eindhoven; Johan van der Maaden, Eindhoven; Jan van Eijk, Eindhoven, all of Netherlands

[73] Assignee: U.S. Philips Corporation, New York, N.Y.

[21] Appl. No.: 871,428

[22] Filed: Apr. 21, 1992

[30] Foreign Application Priority Data

Jul. 30, 1991 [EP] European Pat. Off. ......... 91201970.0

[51] Int. Cl.$^5$ .............................................. G01B 11/00
[52] U.S. Cl. .................... 356/400; 356/375; 355/97; 414/225
[58] Field of Search ............. 356/375, 400; 355/53, 355/97; 414/222, 225, 226, DIG. 3, DIG. 4, DIG. 7

[56] References Cited

U.S. PATENT DOCUMENTS 4,676,637 6/1987 Uto et al. .............................. 356/400
4,999,671 3/1991 Iizuka ................................... 355/97

FOREIGN PATENT DOCUMENTS 60-224144 8/1985 Japan.
62-195143 8/1987 Japan.

Primary Examiner—E. L. Evans
Attorney, Agent, or Firm—Steven R. Biren

[57] ABSTRACT

A positioning device has two transport arms for alternately transferring plate-shaped objects from a storage position into an operational position. The transport arms are each displaceable by means of a separate manipulator, so that a quick exchange of the objects is possible. The manipulators each comprise two parallel Y-guides which are fastened to a frame, and an X-guide which is displaceable along the two Y-guides, while the transport arms are each displaceable along one of the X-guides. The positioning device is used in an optical lithographic device for alternately placing masks on a mask support. A machine frame of the optical lithographic device to which the mask support is fastened is coupled to the frame of the positioning device by spring members. To render an accurate positioning of the masks on the mask support possible, the optical lithographic device is provided with an optical sensor system which is coupled to an electronic control unit for controlling the positioning device.

11 Claims, 7 Drawing Sheets

POSITIONING DEVICE HAVING TWO MANIPULATORS OPERATING IN PARALLEL, AND OPTICAL LITHOGRAPHIC DEVICE PROVIDED WITH SUCH A POSITIONING DEVICE

BACKGROUND OF THE INVENTION

The invention relates to a positioning device having a first and a second transport arm for alternately transferring plate-shaped objects from a storage position into an operational position which extends in a plane transverse to a Z-direction, whereby an object is placable in the operational position by means of the first transport arm after a further object has been taken from the operational position by means of the second transport arm.

The invention also relates to an optical lithographic device provided with a positioning device according to the invention.

A positioning device of the kind mentioned in the opening paragraph is known from Japanese Patent Application no. 62-195143. The known positioning device is used in an optical lithographic device for the manufacture of electric semiconductor circuits, a semiconductor circuit pattern provided on a mask being imaged on a semiconductor substrate. During this, the semiconductor substrate is illuminated through a number of different masks which are taken from a mask magazine one by one and positioned on a mask support of the optical lithographic device by the positioning device.

The known positioning device is provided with a first and a second transport arm which are displaceable along a first and along a second guide parallel to the first, which guides are provided on a turntable which is common to both transport arms. After a first mask has been placed in the operational position by means of the known positioning device, the turntable is rotated towards the mask magazine, after which a second mask is taken from the magazine by means of the first transport arm. Subsequently, the turntable is rotated back towards the mask support, and the first mask is taken from the operational position by the second transport arm, upon which the second mask is placed in the operational position by the first transport arm. Finally, the turntable is rotated towards the mask magazine again and the first mask is returned to the mask magazine by the second transport arm, after which the first transport arm is in a position to take a next mask from the mask magazine again.

A disadvantage of the known positioning device is that the first mask cannot be returned to the mask magazine until after the second mask has been placed in the operational position. As a result, the time duration required after placement of a mask in the operational position for taking a next mask from the mask magazine and putting it in readiness for exchange with the mask present in the operational position is increased, and the production output of the optical lithographic device in which the positioning device is used is adversely affected.

SUMMARY OF THE INVENTION

It is an object of the invention to provide a positioning device of the kind mentioned in the opening paragraph with which the time duration referred to above is reduced.

For this purpose, the invention is characterized in that the transport arms are each displaceable by means of a separate manipulator parallel to an X-direction and to a Y-direction perpendicular to the X-direction, the X-direction and the Y-direction being perpendicular to the Z-direction. Since the transport arms are each displaced by means of a separate manipulator, an object taken from the operational position can be returned to the storage position while the next object is being transferred into the operational position. In addition, a transport arm can remain in a position near an object after providing this object in the operational position, so that the time duration required for subsequently taking the object from the operational position is relatively short.

A special embodiment of the positioning device according to the invention is characterized in that the manipulators each comprise a straight X-guide extending parallel to the X-direction, along which X-guide the relevant transport arm is guided so as to be displaceable, and a straight Y-guide which is fastened to a frame of the positioning device, which extends parallel to the Y-direction, and along which the X-guide is guided so as to be displaceable. The use of the said X- and Y-guides leads to a compact and simple construction of the manipulators. In addition, the transport arms can be displaced over a considerable distance parallel to the X- and the Y-direction by means of the manipulators, so that the transport arms are capable of reaching a large number of storage positions.

A further embodiment of the positioning device according to the invention, which provides a stiff and stable support of the X-guide, is characterized in that the X-guide of each manipulator is guided so as to be displaceable along a first and a second straight Y-guide parallel to the first, the Y-guides of the relevant manipulator being positioned in a plane extending perpendicular to the Z-direction. A yet further embodiment of the positioning device according to the invention, which in addition to a displacement of the object parallel to the X-direction or the Y-direction also renders possible a rotation of the object about a rotation axis directed parallel to the Z-direction, is characterized in that the X-guide of each manipulator is rotatably coupled to a first slide which is displaceable along the first Y-guide and to a second slide which is displaceable along the second Y-guide, while the X-guide is rotatable relative to each slide about a rotation axis directed parallel to the Z-direction, and the X-guide is coupled to the second slide by means of a coupling member which admits of a displacement of the X-guide relative to the second slide parallel to the X-direction. The use of the said coupling member renders possible a change in the distance between the two rotation axes which is necessary in the case of a rotation of the X-guide relative to the Y-guides.

A particular embodiment of the positioning device according to the invention, which provides a stiff and play-free construction of the said coupling member, is characterized in that the coupling member comprises a sleeve which has its rotation bearings about a rotation pin of the second slide directed parallel to the Z-direction and which is coupled to the X-guide by means of a blade spring which extends in a plane transverse to the X-direction.

A further embodiment of the positioning device according to the invention, which provides a particularly stiff and stable guidance of the transport arms along the X-guides, is characterized in that the X-guide of each manipulator is provided with two guide rails which extend parallel to the X-direction.

A still further embodiment of the positioning device according to the invention is characterized in that the two manipulators are positioned at a distance from one another seen in the Z-direction, the Y-guides being positioned in mutually corresponding X- and Y-positions, while the X-guides are positioned between the Y-guides seen in the Z-direction. The positioning of the X- and Y-guides of the manipulators relative to one another in this way provides two substantially identical manipulators, so that the objects can be placed in the operational position with equal accuracy by both manipulators, while in addition a particularly simple construction of the positioning device is provided.

An optical lithographic device in which the properties of the positioning device used therein are particularly effective, is characterized in that the optical lithographic device, seen in the Z-direction, is provided in that order with an object table having a support surface extending transverse to the Z-direction, a lens system having a main optical axis directed parallel to the Z-direction, a mask support for supporting a mask in a plane directed transverse to the Z-direction, and a light source for illuminating a substrate supported by means of the object table, while the optical lithographic device is further provided with a mask magazine from which masks can be transferred to the mask support alternately by means of the positioning device.

A special embodiment of the optical lithographic device according to the invention is characterized in that the frame of the positioning device is coupled to a machine frame of the optical lithographic device, to which the lens system is fastened, by means of at least one spring member and at least one damping member. The use of the spring member and the damping member prevents an undesirable transmission of mechanical vibrations from the positioning device to the lens system and other precision components of the optical lithographic device.

A further embodiment of the optical lithographic device according to the invention is characterized in that the optical lithographic device is provided with a first position sensor near the mask support for measuring a position relative to the lens system of a mask to be positioned on the mask support by means of a transport arm, while the optical lithographic device is further provided with a second position sensor for measuring a position of the frame of the positioning device relative to the lens system. The use of the said position sensors renders it possible to align the mask in an accurate manner by means of the relevant manipulator relative to the lens system before the mask is placed on the mask support by the relevant transport arm.

A yet further embodiment of the optical lithographic device according to the invention is characterized in that the optical lithographic device is provided with a position sensor near the mask support for measuring a position relative to the lens system of a mask to be positioned on the mask support by means of a transport arm, while the optical lithographic device is further provided with a fixed coupling by means of which the frame of the positioning device is couplable to the machine frame during the displacement of the mask from the position sensor to the mask support by means of the relevant transport arm. An accurate positioning of the mask on the mask support is obtained through the use of the said fixed coupling.

BRIEF DESCRIPTION OF THE DRAWING

The invention is explained in more detail below with reference to the drawing, in which.

DESCRIPTION OF THE PREFERRED EMBODIMENTS

Figure 1:
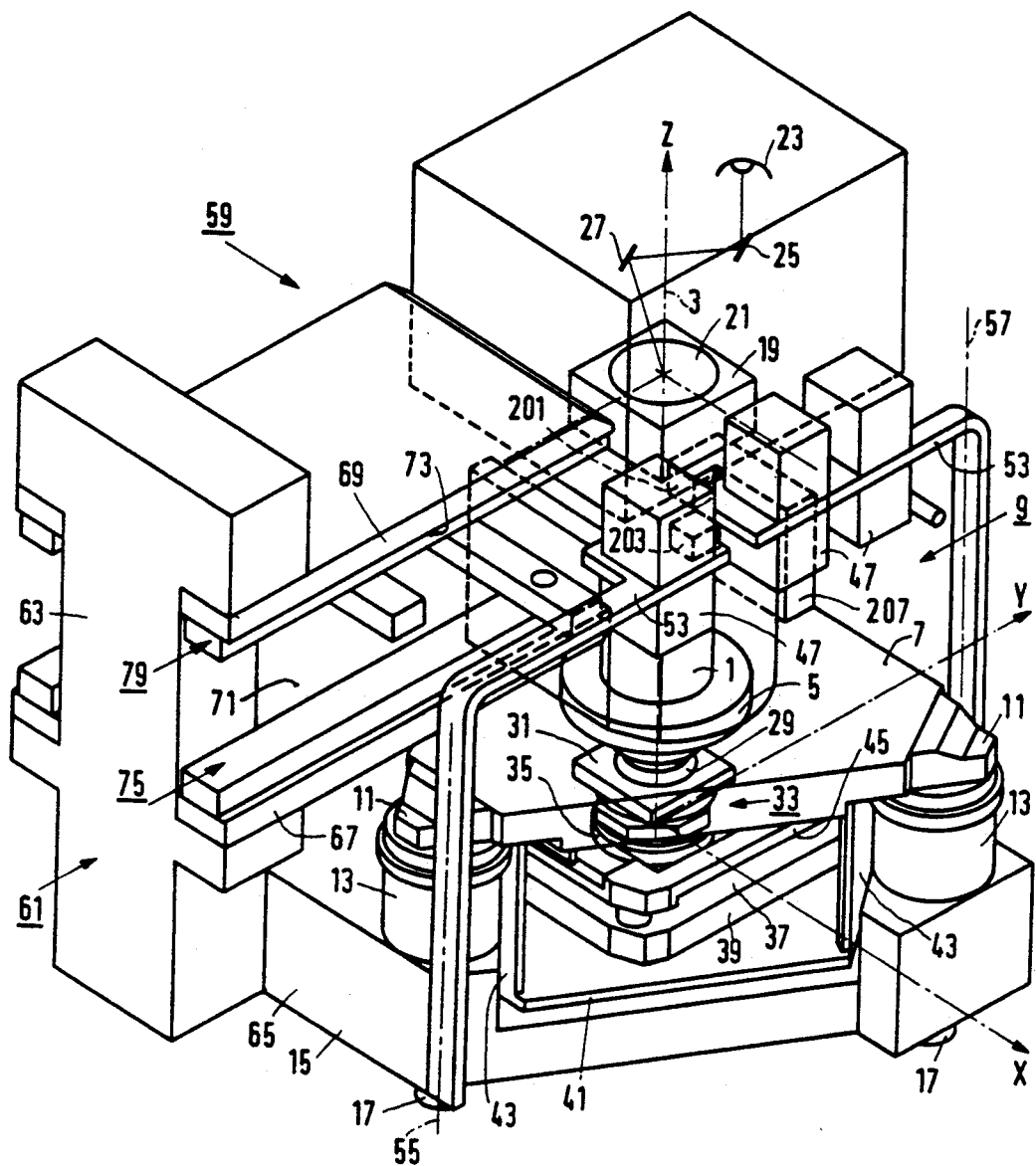
FIG. 1 shows an optical lithographic device according to the invention.

The optical lithographic device illustrated in FIGS. 1 to 6 is provided with a lens system 1, depicted only diagrammatically in FIG. 1, having an optical main axis 3 extending parallel to a vertical Z-direction. Near a lower side, the lens system 1 is provided with a metal mounting ring 5 by means of which the lens system 1 is fastened to a mounting member 7 of a machine frame 9 of the optical lithographic device. The mounting member 7 is a substantially triangular metal plate which extends in a plane perpendicular to the Z-direction and is provided with three corner portions 11. The mounting member 7 rests on a frame support 13 near each of the corner portions 11. Only two corner portions 11 and two frame supports 13 are visible in FIG. 1. The frame supports 13 are positioned on a base 15 of the optical lithographic device, which base is placed on a flat foundation by means of adjustment members 17. Each frame support 13 is provided with a spring member and a damping member (not shown in detail in FIG. 1) of a kind usual per se, so that the machine frame 9 is low-frequency (approximately 3 Hz) spring-supported relative to the base 15 in directions parallel and transverse to the Z-direction. An undesirable transmission of vibrations from the foundation through the base 15 to the machine frame 9 and the lens system 1 is prevented through the use of the frame supports 13.

As is shown in FIG. 1, the optical lithographic device is provided with a mask support 19 near an upper side of the lens system 1 for supporting a mask 21 relative to the lens system 1. The mask 21, which comprises, for example, an integrated semiconductor circuit pattern, extends on the mask support 19 in a plane transverse to the Z-direction. A light beam coming from a light source 23 is conducted through the mask 21 by mirrors 25 and 27 during operation and focused on a substrate, for example a semiconductor substrate 29 placed on a support surface of an object table 31 extending transverse to the Z-direction, by means of the lens system 1. In this manner the pattern of the mask 21 is imaged on the semiconductor substrate 29 on a reduced scale.

The object table 31 is displaceable step wise by means of a positioning device 33 only partly visible in FIG. 1 parallel to an X-direction, which is perpendicular to the Z-direction, and parallel to a Y-direction, which is perpendicular to the X- and the Z-direction. The object table 31 in this case is guided without contact along a base surface 37 extending perpendicular to the Z-direction by means of a so-called aerostatically supported foot 35, the base surface 37 being an upper surface of a granite support slab 39 on which the positioning device 33 is fastened. The support slab 39 is provided on a carrier plate 41 which is suspended from a lower side 45 of the mounting member 7 by means of vertical panels 43. The positioning device 33 and the aerostatically supported foot 35 are of a kind which is known from U.S. Pat. No. 4,737,823. The semiconductor substrate 29 is illuminated in a large number of positions corresponding to identical circuits in that the object table 31 is displaced into different exposure positions step wise by means of the positioning device 33.

Figure 2:
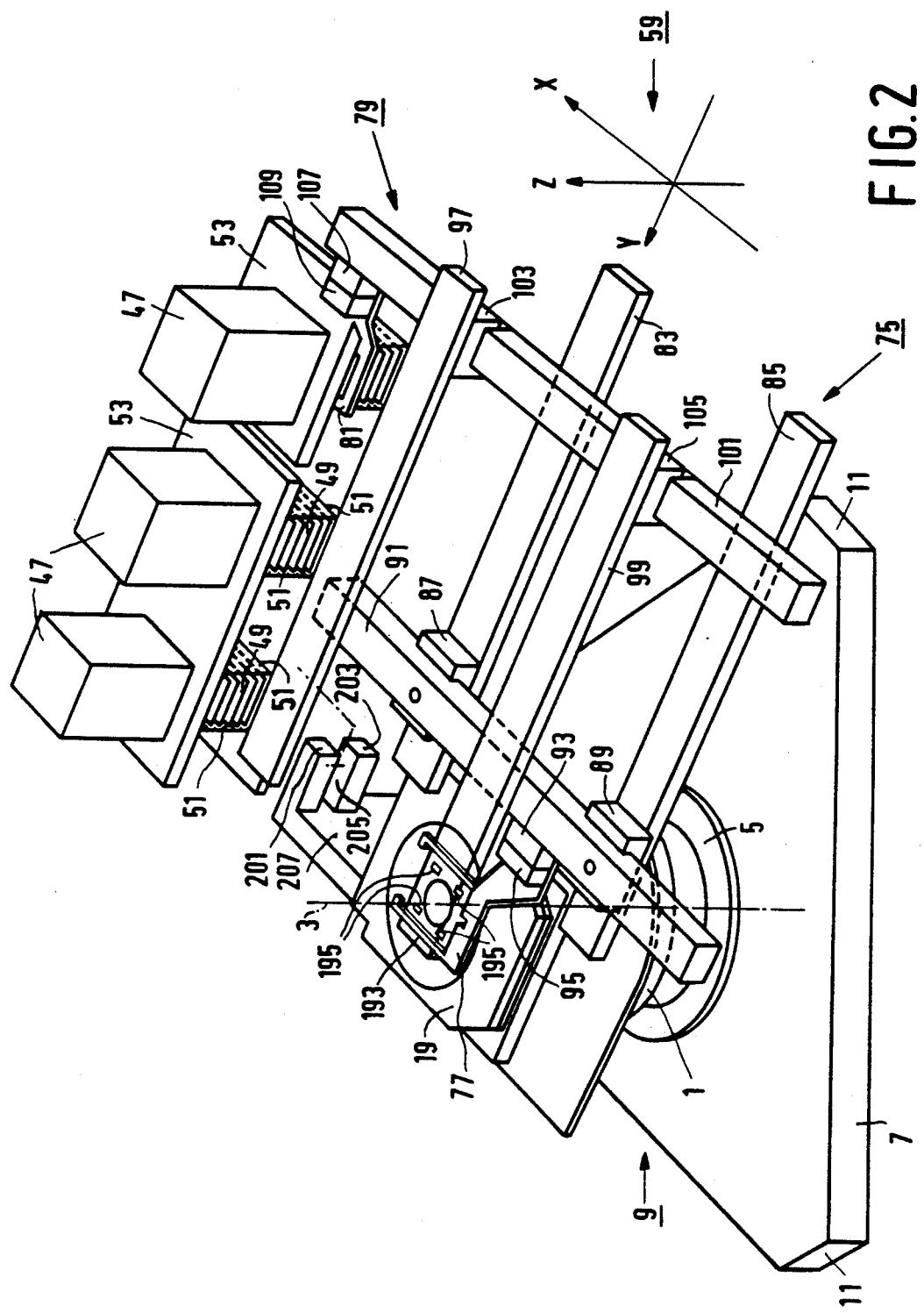
FIG. 2 shows the positioning device according to FIG. 1, a frame of the positioning device not being depicted.

To obtain complex semiconductor structures, the semiconductor substrate 29 is to be illuminated with different masks in succession. As is shown in FIGS. 1 and 2, the optical lithographic device is for this purpose equipped with a number of mask magazines 47 in which the masks 49 required for illuminating the semiconductor substrate 29 are stacked. The masks 49 in this arrangement each rest with two lateral sides on two parallel support ledges 51 which extend in a plane transverse to the Z-direction, which are provided on an inner side of the relevant mask magazine 47, and which extend substantially parallel to the X-direction in the operational position of the mask magazines 47 depicted in FIG. 1. The mask magazines 47 are arranged next to one another seen in the Y-direction on a carrier platform 53 which is fastened to the base 15. For a simple and quick exchange of the mask magazines 47 and for a good accessibility of the optical lithographic device, the carrier platform 53 is rotatable in two parts relative to the base 15 about respective vertical rotation axes 55 and 57.

As is shown in FIG. 1, the optical lithographic device is further provided with a positioning device 59 by means of which the masks 49 can be placed alternately on the mask support 19 from the mask magazines 47. The positioning device 59, depicted only diagrammatically in FIG. 1, is provided with a frame 61 which is fastened to the base 15 of the optical lithographic device. An undesirable transmission of the mechanical vibrations caused by the positioning device 59 during operation to the machine frame 9 and the lens system 1 is prevented by means of the frame supports 13 in that both the frame 61 of the positioning device 59 and the carrier platform 53 of the mask magazines 47 are fastened to the base 15.

As FIG. 1 shows, the frame 61 of the positioning device 59 comprises a column 63 which extends parallel to the Z-direction and which is fastened near a lower side to a lateral face 65 of the base 15. A first support plate 67 and a second support plate 69 are fastened to the column 63 at a distance from one another seen in the Z-direction, both directed towards the lens system 1 away from the column 63, an upper surface 71 of the first support plate 67 and a lower surface 73 of the second support plate 69 both extending perpendicular to the Z-direction. A first XY-manipulator 75 of the positioning device 59 is fastened to the upper surface 71 of the first support plate 67, by which manipulator a first gripper arm 77 (see FIG. 2) is displaceable parallel to the X- and the Y-direction, while a second XY-manipulator 79 belonging to the positioning device 59 and substantially identical to the first XY-manipulator 75 is fastened to the lower surface 73 of the second support plate 69, by which manipulator a second gripper arm 81 (see FIG. 2) is displaceable parallel to the X- and the Y-direction. It is noted that the first XY-manipulator 75 and the second XY-manipulator 79 are only partly visible in FIG. 1.

In FIG. 2, the frame 61 of the positioning device 59 is not shown, so that the two XY-manipulators 75 and 79 are visible in more detail in this Figure. As FIG. 2 shows, the first XY-manipulator 75 comprises a first straight Y-guide 83 and a second straight Y-guide 85 parallel to the first, both extending parallel to the Y-direction and both fastened to the upper surface 71 of the first support plate 67. A first and a second slide 87, 89 are displaceably guided along the first and the second Y-guide 83, 85, respectively. The first XY-manipulator 75 further comprises a straight X-guide 91 which extends substantially parallel to the X-direction and which is coupled to the first slide 87 and the second slide 89 in a manner to be described further below. A third slide 93, to which the first gripper arm 77 mentioned above is fastened by means of a Z-manipulator 95 of a kind known per se, is displaceably guided along the X-guide 91. The first gripper arm 77 can be moved parallel to the X-direction through a displacement of the third slide 93 along the X-guide 91, while the first gripper arm 77 is movable parallel to the Y-direction through equal displacements of the first and the second slide 87, 89 along the first and the second Y-guide 83, 85, respectively. Similarly, the second XY-manipulator 79 is provided with a first straight Y-guide 97 and a second straight Y-guide 99, both directed parallel to the Y-direction. The Y-guides 97 and 99 are fastened to the lower surface 73 of the second support plate 69 in X- and Y-positions which correspond to the X- and Y-positions of the first and the second Y-guide 83 and 85 of the first XY-manipulator 75. Furthermore, the second XY-manipulator 79 also comprises a straight X-guide 101 which extends substantially parallel to the X-direction and which is coupled to a first slide 103 movable along the first Y-guide 97 and to a second slide 105 movable along the second Y-guide 99 in a similar manner as the X-guide 91 of the first XY-manipulator 75. A third slide 107, to which the second gripper arm 81 is fastened by means of a Z-manipulator 109 identical to the said Z-manipulator 95, is displaceably guided along the X-guide 101. The positioning device 59 with the two identical XY-manipulators 75 and 79 is thus of a simple and robust construction. The two X-guides 91 and 101 with the gripper arms 77 and 81 are arranged between the Y-guides 83, 85, 97 and 99 therein, seen in the Z-direction, so that the gripper arms 77 and 81 have the same ranges seen in the X-and the Y-direction as well as in the Z-direction. The first XY-manipulator 75 will be discussed in further detail below.

Figure 3:
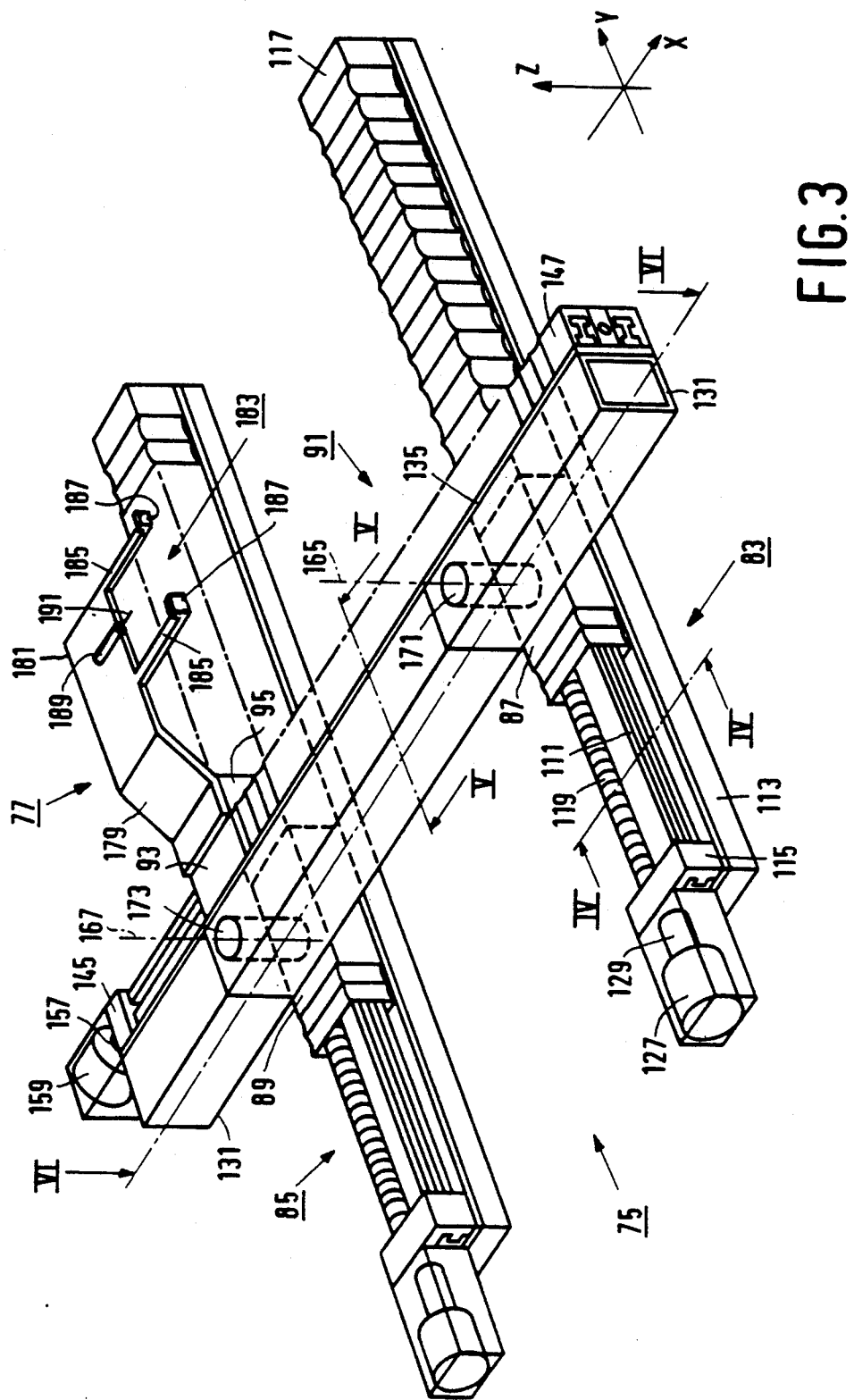
FIG. 3 shows an XY-manipulator of the positioning device according to FIG. 2 in detail.
Figure 4:
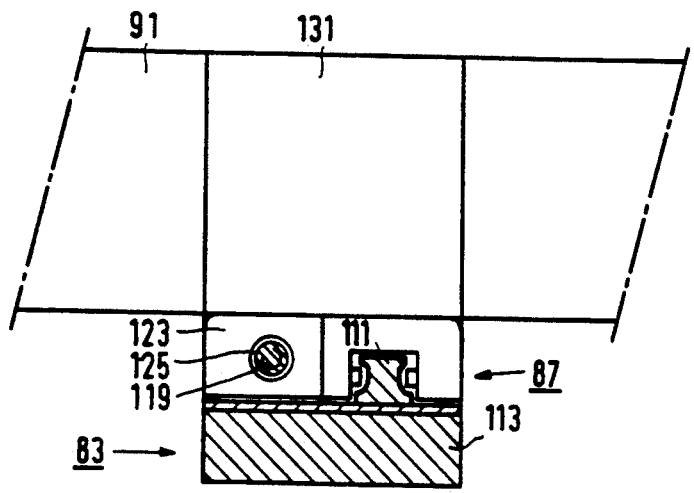
FIG. 4 shows a cross-section of a Y-guide of the XY-manipulator taken on the line IV—IV in FIG. 3.

FIGS. 3 to 6 show some details of the first XY-manipulator 75. The details of the second XY-manipulator 79 are identical and are not discussed in the following text. As FIGS. 3 and 4 show, the first Y-guide 83 comprises a guide rail 111 directed parallel to the Y-direction along which the first slide 87 is guided by means of roller members which are not visible in FIGS. 3 and 4. The guide rail 111 is fastened on an oblong base plate 113 which near its two ends is provided with respective upright end walls 115 and 117 (see FIG. 3). The first Y-guide 83 is further provided with a spindle 119 which is parallel to the guide rail 111 and which has its rotation bearings in the two end walls 115 and 117. As FIG. 4 shows, furthermore, the first slide 87 comprises a nut housing 123 with a sleeve nut 125 which is in engagement with the spindle 119. FIG. 3 further shows diagrammatically an electric drive motor 127 which is fastened on the base plate 113 near the end wall 115 and whose output shaft 129 is directly coupled to the spindle 119. The use of a direct coupling between the spindle 119 and the output shaft 129 of the drive motor 127 in combination with a large transmission ratio between the spindle 119 and the sleeve nut 125 provides an accurate, substantially play-free drive of the first slide 87 along the guide rail 111. It is noted that the second Y-guide 85 is constructed in the same manner.

Figure 5:
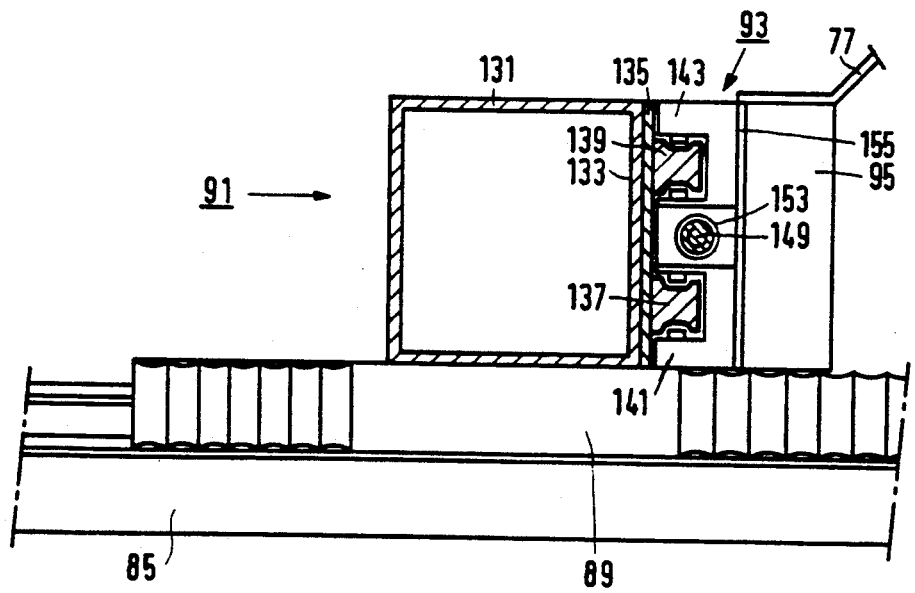
FIG. 5 shows a cross-section of an X-guide of the XY-manipulator taken on the line V—V in FIG. 3.

As is shown in FIGS. 3 and 5, the X-guide 91 comprises a box girder 131. On the side 133 of the girder 131 facing the lens system 1 is provided an oblong base plate 135 on which two guide rails 137 and 139 extending parallel to the X-direction are fastened. A first slide portion 141 and a second slide portion 143 of the third slide 93 are guided along the guide rails 137 and 139, respectively, by means of roller members not visible in FIGS. 3 and 5. The base plate 135 is provided near its two ends with respective upright end walls 145 and 147 (see FIG. 3). A spindle 149 directed parallel to the X-direction and arranged between the two slide portions 141 and 143 (see FIG. 5) has its rotation bearings in the end walls 145 and 147 and is in engagement with a sleeve nut 153 which is fastened to the two slide portions 141 and 143 by means of a bridge plate 155. The spindle 149 is directly coupled to an output shaft 157 of an electric drive motor 159 which is fastened to the base plate 135 near the end wall 145.

Figure 6:
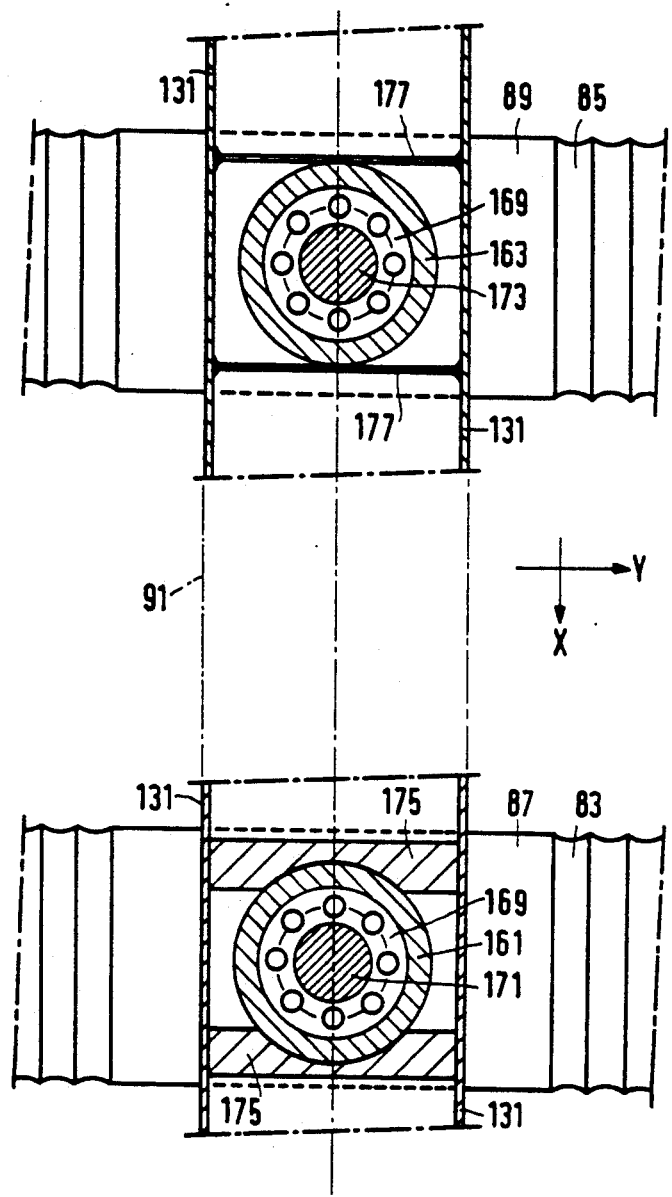
FIG. 6 shows a longitudinal section of the X-guide of the XY-manipulator taken on the line VI—VI in FIG. 3, FIG. 7 diagrammatically shows a control system for controlling the XY-manipulator according to FIG. 3.

As shown in FIG. 6, the X-guide 91 is provided with a first and a second bearing bush 161 and 163 having centerlines 165 and 167 directed parallel to the Z-direction. The bearing bushes 161 and 163 are each rotatably supported by means of two ball bearings 169 arranged at a distance from one another seen in the Z-direction about a first rotation pin 171 arranged coaxially with the bearing bush 161 and fastened on the first slide 87 and a second rotation pin 173 arranged coaxially with the bearing bush 163 and fastened on the second slide 89, respectively. The first bearing bush 161, as FIG. 6 shows, is fastened to the box girder 131 by means of two mounting blocks 175, so that the centerline 165 of the first bearing bush 161 (see FIG. 3) forms an axis of rotation which is fixed relative to the X-guide 91 in the X- and Y-direction. The second bearing bush 163 is coupled to the box girder 131 by means of two blade springs 177 which each extend in a plane transverse to the X-direction. The use of the blade spring 177 renders the second bearing bush 163 displaceable relative to the girder 131 over a small distance parallel to the X-direction. In this manner it is possible to rotate the X-guide 91 through a small angle about the centerline 165 by means of unequal displacements of the first and the second slide 87 and 89 along the first and the second Y-guide 83 and 85, respectively, whereby the spacing between the centerline 165 of the first bearing bush 161 and the centerline 167 of the second bearing bush 163 is automatically adapted through an elastic deformation of the two blade springs 177.

As was noted above, the first gripper arm 77 is coupled to the third slide 93 via a Z-manipulator 95 of a type known per se. The gripper arm 77 is displaceable parallel to the Z-direction relative to the third slide 93 by means of the Z-manipulator 95 which is fastened to the bridge plate 155 and which is depicted only diagrammatically in FIGS. 3 and 5. The Z-manipulator 95 may comprise, for example, a slide which is displaceable by means of a nut and lead screw or rack and pinion along a guide rail provided at the bridge plate 155 and extending in the Z-direction. An alternative embodiment of the Z-manipulator 95, with which accurate displacements parallel to the Z-direction are obtained, also comprises a slide displaceable along a guide rail with a round cam follower which bears on a plate cam, which plate cam is driven by means of a drive motor fastened on the bridge plate 155.

As FIG. 3 shows, the gripper arm 77 comprises a plate-shaped arm 179 extending perpendicular to the Z-direction and provided near its end 181 facing the lens system 1 with a bipartite fork 183 having fork portions 185 directed parallel to the X-direction and situated in the plane of the arm 179, which fork portions are each provided with an upright support rim 187 near their ends. Since the third slide 93 is guided along the two parallel guide rails 137 and 139 (see FIG. 5), a stable and stiff guiding of the gripper arm 77 parallel to the X-direction is obtained, a moment depending on the weight of the gripper arm 77 being transmitted to the box girder 131 via the normal forces exerted on the guide rails 137 and 139 by the two slide portions 141 and 143.

To take a mask 49 from one of the mask magazines 47, the fork 183 of the gripper arm 77 is brought to below the relevant mask 49 by means of the XY-manipulator 75. Then the gripper arm 77 is moved up by the Z-manipulator 95, whereby the fork portions 185 enter between the relevant support ledges 51 of the mask magazine 47 and the mask 49 lies on the fork portions 185. As FIG. 3 shows, the gripper arm 77 is further provided with a pneumatic cylinder 189 with a pin 191 which is moved against the mask 49, so that the mask 49 is clamped between the pin 191 and the said support ridges 187 of the fork portions 185 in an accurate position relative to the gripper arm 77.

As is further depicted in FIG. 2, four support blocks 195 whose upper surfaces are situated in a common plane which is perpendicular to the Z-direction are arranged around a light channel 193 of the mask support 19. When a mask 49 is to be provided on the mask support 19, the relevant mask 49 is first moved above the support blocks 195 by the XY-manipulator 75, after which the gripper arm 77 is moved down by the Z-manipulator 95 until the mask 49 rests on the four support blocks 195. Then the mask 49 is pressed onto the support blocks 95 by means of an underpressure system not shown in the Figure, and the pin 191 of the gripper arm 77 is retracted by the cylinder 189, upon which the gripper arm 77 is moved down over a short distance into a waiting position by the Z-manipulator 95. The mask 49 is thus cleared from the gripper arm 77, which remains near the mask 49 in the waiting position during the exposure of the semiconductor substrate 29 through the relevant mask 49. The operations described above are then carried out in reverse order for removing the mask 49 from the mask support 19 after the illumination.

Figure 7:
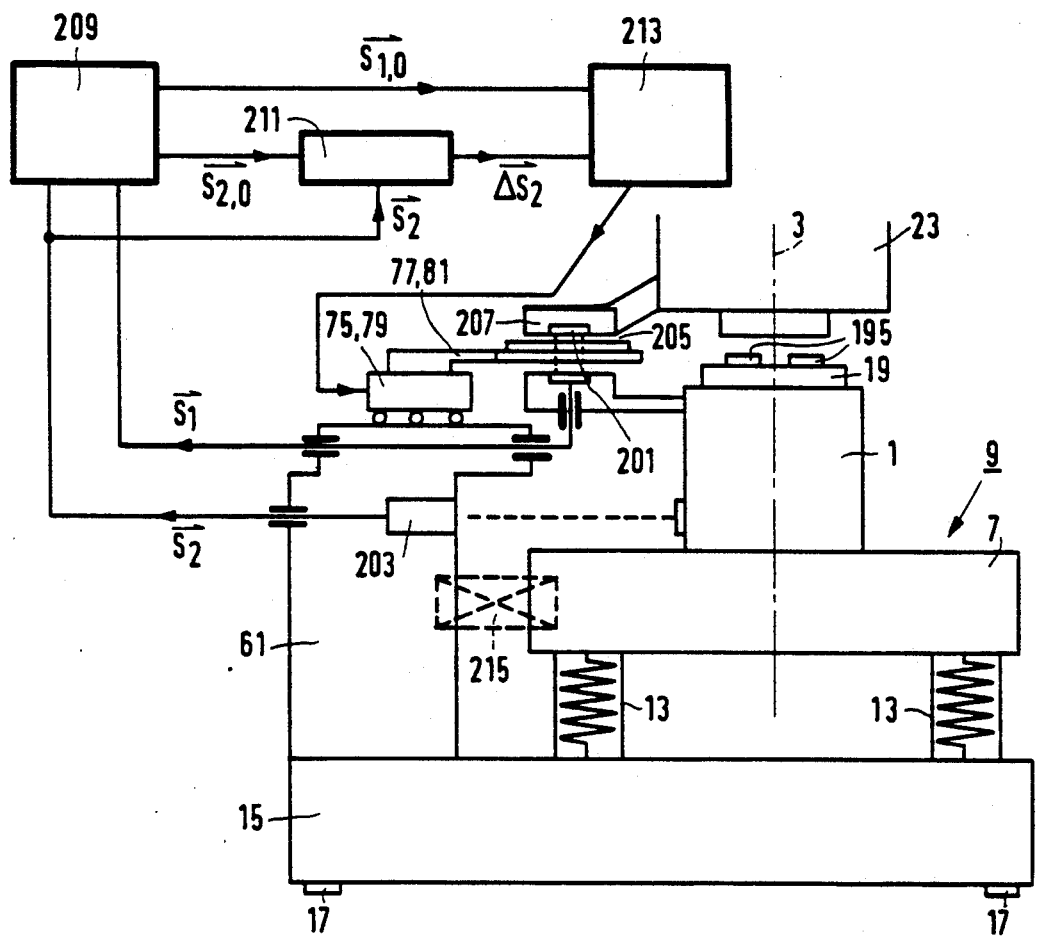

As was noted above, the frame 61 of the positioning device 59 is fastened directly to the base 15, whereas the machine frame 9, to which the lens system 1 and the mask support 19 are fastened, is low-frequency spring-supported relative to the base 15 by means of the frame supports 13. The machine frame 9 as a result performs a very slight swinging movement relative to the frame 61 of the positioning device 59 during operation under the influence of reaction forces caused by the positioning device 33 of the object table 31, so that the positions of the gripper arms 77 and 81 relative to the mask support 19 are not unequivocally defined. The consequence may be that, under special conditions where a maximum positioning accuracy is required, this accuracy is not achieved. To render possible the desired, very accurate positioning of a mask 49 on the mask support 19 under the said circumstances, a special embodiment of the optical lithographic device is provided with a first optical position sensor 201 of a kind known per se by which the X-, Y- and Z-positions ($\vec{s_1}$) of the mask 49 supported by one of the gripper arms 77, 81 relative to the lens system 1 can be measured, and a second optical position sensor 203 by which the X-, Y- and Z-positions ($\vec{s_2}$) of the frame 61 of the positioning device 59 relative to the lens system 1 can be measured. The position sensors 201 and 203 are diagrammatically depicted in FIGS. 1 and 2, while FIG. 7 diagrammatically shows a control system which controls the two XY-manipulators 75 and 79.

As is shown in FIGS. 1 and 2, the position sensor 201 is provided in an opening 205 of a sensor housing 207 which is fastened to the machine frame 9 and is arranged between the mask support 19 and the carrier platform 53, which opening extends transverse to the Z-direction. After the relevant mask 49 has been taken from the mask magazine 47 by the relevant gripper arm 77, 81, the mask 49 is first brought into the opening 205 of the sensor housing 207 by means of the gripper arm 77, 81. In this position, the position sensor 201 measures the position $\vec{s_1}$ of the mask 49 relative to the lens system 1. As FIG. 7 shows, the electric outputs of the position sensors 201 and 203 are connected to an electronic sampler 209 which registers an initial position $\vec{s_{1,0}}$ of the mask 49 relative to the lens system 1 and an initial position $\vec{s_{2,0}}$ of the frame 61 relative to the lens system 1 at a predetermined moment during the stay of the mask 49 in the sensor housing 207. Subsequently, the mask 49 is moved from the sensor housing 207 to the mask support 19 over the distance $\vec{s_{1,0}}$ by means of the relevant XY-manipulator 75, 79. During this displacement, the difference $\Delta\vec{s_2} = \vec{s_2} - \vec{s_{2,0}}$ between the initial position $\vec{s_{2,0}}$ and the instantaneous position $\vec{s_2}$ is continually determined by a subtraction circuit 211 depicted in FIG. 7, the said instantaneous position being continually measured by the second position sensor 203. The displacement of the relevant XY-manipulator 75, 79 is controlled by an electronic controller 213 which receives a signal which is a function of the initial position $\vec{s_{1,0}}$ from the sampler 209 and a signal which is a function of the difference $\Delta\vec{s_2}$ from the subtraction circuit 211. During the displacement of the mask 49 from the sensor housing 207 to the mask support 19, the controller 213 corrects the measured initial position $\vec{s_{1,0}}$ of the mask 49 relative to the lens system 1 for movements of the machine frame 9 relative to the frame 61, which may take place during the said displacement, by means of the signal $\Delta\vec{s_2}$. In spite of the said movements, therefore, an accurate positioning of the mask 49 on the mask support 19 can be achieved by means of the positioning device 59.

Instead of the position sensor 203, a coupling mechanism 215 may alternatively be used by which the machine frame 9 can be temporarily coupled in a fixed position relative to the frame 61. The coupling mechanism 215 is diagrammatically shown in FIG. 7 by means of broken lines. Before the position $\vec{s_{1,0}}$ of the mask 49 relative to the lens system 1 is measured by the position sensor 201, the machine frame 9 is coupled to the frame 61 by the coupling mechanism 215. During the displacement of the mask 49 from the sensor housing 207 to the mask support 19, the machine frame 9 remains coupled to the frame 61, so that undesirable movements of the machine frame 9 relative to the frame 61 are prevented. The use of the coupling mechanism 215 renders an accurate positioning of the mask 49 on the mask support 19 possible, but it implies a more complicated construction of the optical lithographic device.

Figure 8:
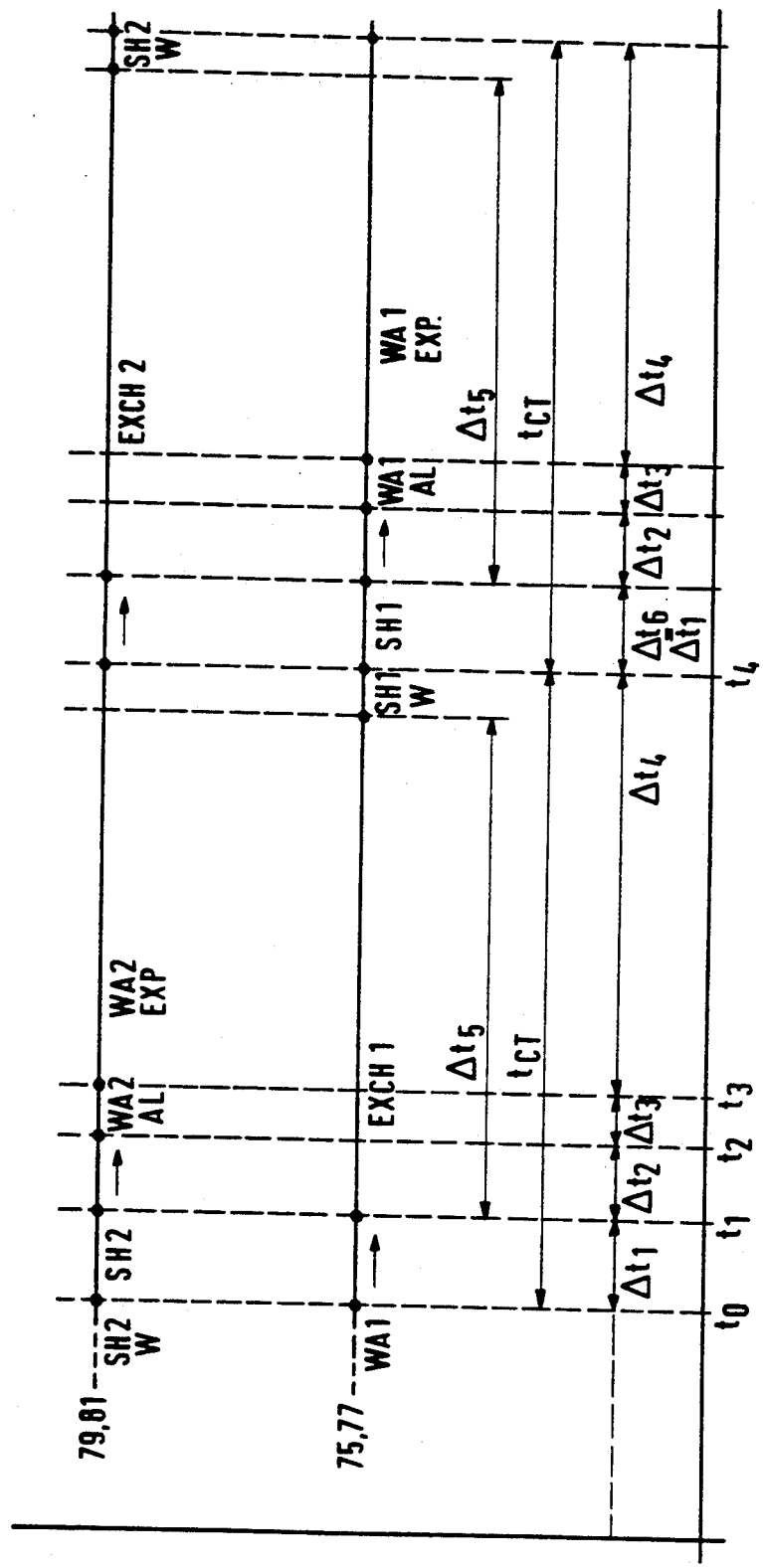
FIG. 8 shows a time diagram of the operation of the positioning device of FIG. 2.

Some details of the first XY-manipulator 75 were discussed above with an indication of how a mask 49 is taken from the relevant mask magazine 47 and placed on the mask support 19 by the XY-manipulator 75. In the following passage the cooperation between the two XY-manipulators 75 and 79 of the positioning device 59 is discussed in more detail. The time diagram in FIG. 8 shows the consecutive operations of the two XY-manipulators 75 and 79 as a function of time. At the initial moment $t_0$ shown in FIG. 8, the first gripper arm 77 is in the waiting position (WA1) near the mask support 19 on which a first mask 49a is present, while the second gripper arm 81 is in the sensor housing 207 (SH2-W) with a second mask 49b. At the moment $t_0$ the illumination of the semiconductor substrate 29 through the mask 49a is ended, upon which the mask 49a is moved ($\rightarrow$) parallel to the Y-direction to outside the mask support 19 by means of the first gripper arm 77 during the time duration $\Delta t_1$ shown in FIG. 8. Since the first gripper arm 77 is near the mask 49a during the illumination of the semiconductor substrate 29, the said time duration $\Delta t_1$ is relatively short. During the time $\Delta t_1$, the position measurement of the mask 49b by the first position sensor 201 also takes place (SH2), after which the mask 49b is moved ($\rightarrow$) from the sensor housing 207 to the mask support 19 by the second gripper arm 81 at the moment $t_1$. This occupies a time $\Delta t_2$, after which the second gripper arm 81 is in the waiting position (WA2) at the moment $t_2$. From the moment $t_2$ onwards, the semiconductor substrate 29 is first aligned relative to the mask 49b (WA2-AL, time duration $\Delta t_3$), after which the illumination of the semiconductor substrate 29 starts at the moment $t_3$ (WA2-EXP). The exposure time is indicated in FIG. 8 as time duration $\Delta t_4$. The first mask 49a, meanwhile, is returned to the relevant mask magazine 47 by the first gripper arm 77 starting from the moment $t_1$, after which a next mask 49c is taken from the mask magazine 47 by the first gripper arm 77 and is brought into the sensor housing 207 (EXCH1). The total duration from the moment $t_1$ until the position SH1-W is reached is indicated in FIG. 8 as the exchange time $\Delta t_5$. In general, the first gripper arm 77 reaches the position SH1-W before the end of the exposure time $\Delta t_4$, so that the total cycle time indicated with $t_{CT}$ in FIG. 8 is mainly determined by the exposure time $\Delta t_4$. The end of the exposure time is indicated as the moment $t_4$ in FIG. 8, after which for a time duration $\Delta t_6$ the mask 49b is removed ($\rightarrow$) from the mask support 19 by the second gripper arm 81 while simultaneously the position of the mask 49c is measured by the first position sensor 201 (SH1). The next operations of the gripper arm 77, as is further shown in FIG. 8, correspond to the operations of the gripper arm 81 described above, while the next operations of the gripper arm 81 correspond to the operations of the gripper arm 77 described above.

It is evident from the above that the use of two separate XY-manipulators 75 and 79 provides a quick exchange of the masks 49. FIG. 8 shows that the time duration $\Delta t_1 + \Delta t_2$ during which no mask 49 is present on the mask support 19 is relatively short compared with the cycle time $t_{CT}$. After the removal of the mask 49a from the mask support 19, the said mask 49a can be immediately returned to the mask magazine 47, so that the next mask 49c can generally be brought into the sensor housing 207 before the end of the exposure time of the mask 49b present at that moment on the mask support 19. If only two masks 49a, 49b are used for illuminating the semiconductor substrate 29, the mask 49a is immediately moved into the sensor housing 207 after being taken from the mask support 19.

The use of the separate XY-manipulators 75 and 79 in addition achieves that a mask 49 need be gripped only twice by the relevant gripper arm 77, 81 during a cycle, so that wear of the mask and pollution of the optical lithographic device caused by this are limited.

It is noted that the positioning device according to the invention with two manipulators operating in parallel is particularly suitable for positioning semiconductor substrates on the object table of an optical lithographic device on account of its accurate and fast operation. Furthermore, the positioning device according to the invention is also applicable in other production or processing machines in which a quick succession of objects to be treated is necessary in conjunction with a high positioning accuracy.

It is further noted that instead of the XY-manipulators described above a different type of manipulator can alternatively be used in the positioning device. For example, two manipulators known from European Patent Application EP-A1-0232930 may alternatively be used with the application of a positioning device according to the invention with two manipulators operating in parallel in an optical lithographic device, whereby a quick and accurate exchange of masks is obtained.

It is finally noted that instead of the blade springs 177, with which the second bearing bush 163 is fastened to the box girder 131, an alternative coupling may be used which allows of a displacement of the X-guide 91, 101 relative to the second slide 89, 105. Thus, for example, the X-guide 91, 101 may be guided along a straight guide, which is fastened to the second slide 89, 105 and which extends parallel to the X-direction, by means of roller members.

We claim:

1. A positioning device, which comprises:
    a first and a second transport arm for alternately transferring plate-shaped objects from a storage position into an operational position which extends in a plane transverse to a Z-direction;
    means comprising the second transport arm for transferring a first object from the operational position; and
    means comprising the first transport arm for subsequently placing a second object in the operational position;
    separate manipulator means for displacing each of the first and second transport arms parallel to an X-direction and to a Y-direction perpendicular to the X-direction, the X-direction and the Y-direction being perpendicular to the Z-direction.

2. A positioning device as claimed in claim 1, characterized in that the manipulators means each comprise a straight X-guide extending parallel to the X-direction, along which X-guide the relevant transport arm is guided so as to be displaceable, and a straight Y-guide which is fastened to a frame of the positioning device, which extends parallel to the Y-direction, and along which the X-guide is guided so as to be displaceable.

3. A positioning device as claimed in claim 2, characterized in that the X-guide of each manipulator means is adapted to be guided so as to be displaceable along a first and a second straight Y-guide parallel to the first, the Y-guides of the relevant manipulator being positioned in a plane extending perpendicular to the Z-direction.

4. A positioning device as claimed in claim 3, characterized in that the X-guide of each manipulator means is rotatably coupled to a first slide which is displaceable along the first Y-guide and to a second slide which is displaceable along the second Y-guide, while the X-guide is rotatable relative to each slide about a rotation axis directed parallel to the Z-direction, and the X-guide is coupled to the second slide by means of a coupling member which admits of a displacement of the X-guide relative to the second slide parallel to the X-direction.

5. A positioning device as claimed in claim 4, characterized in that the coupling member comprises a sleeve which has its rotation bearings about a rotation pin of the second slide directed parallel to the Z-direction and which is coupled to the X-guide by means of a blade spring which extends in a plane transverse to the X-direction.

6. A positioning device as claimed in claim 2, characterized in that the X-guide of each manipulator means is provided with two guide rails which extend parallel to the X-direction.

7. A positioning device as claimed in claim 2, characterized in that the two manipulator means are positioned at a distance from one another viewed in the Z-direction, the Y-guides being positioned in mutually corresponding X- and Y-positions, while the X-guides are positioned between the Y-guides viewed in the Z-direction.

8. An optical lithographic device provided with a positioning device as claimed in claim 1, characterized in that the optical lithographic device, viewed in the Z-direction, is provided in that order with an object table having a support surface extending transverse to the Z-direction, a lens system having a main optical axis directed parallel to the Z-direction, a mask support for supporting a mask in a plane directed transverse to the Z-direction, and a light source for illuminating a substrate supported by means of the object table, and the optical lithographic device is further provided with a mask magazine from which masks can be transferred to the mask support alternately by means of the positioning device.

9. An optical lithographic device as claimed in claim 8, characterized in that a frame of the positioning device is coupled to a machine frame of the optical lithographic device, to which the lens system is fastened, by means of at least one spring member and at least one damping member.

10. An optical lithographic device as claimed in claim 9, characterized in that the optical lithographic device is provided with a first position sensor near the mask support for measuring a position relative to the lens system of a mask to be positioned on the mask support by means of a transport arm, and the optical lithographic device is further provided with a second position sensor for measuring a position of the frame of the positioning device relative to the lens system.

11. An optical lithographic device as claimed in claim 9, characterized in that the optical lithographic device is provided with a position sensor near the mask support for measuring a position relative to the lens system of a mask to be positioned on the mask support by means of a transport arm, and the optical lithographic device is further provided with a fixed coupling by means of which the frame of the positioning device is couplable to the machine frame during the displacement of the mask from the position sensor to the mask support by means of the relevant transport arm.

* * * * *